United States Patent [19]

Hardy

[11] Patent Number: 5,495,182
[45] Date of Patent: Feb. 27, 1996

[54] FAST-FULLY RESTORING POLARITY CONTROL CIRCUIT

[75] Inventor: Brett Hardy, San Jose, Calif.

[73] Assignee: Altera Corporation, San Jose, Calif.

[21] Appl. No.: 395,733

[22] Filed: Feb. 28, 1995

[51] Int. Cl.⁶ .............................................. H03K 19/173
[52] U.S. Cl. ................................ 326/50; 326/38; 327/530
[58] Field of Search .................................. 326/38, 50, 58, 326/45, 121; 327/530

[56] References Cited

U.S. PATENT DOCUMENTS

| | | | |
|---|---|---|---|
| 4,558,236 | 12/1985 | Buerows | 326/50 |
| 4,894,563 | 1/1990 | Gudger | 326/38 |
| 4,914,322 | 4/1990 | Win | 326/38 |
| 4,968,903 | 11/1990 | Smith | 326/50 |

*Primary Examiner*—Edward P. Westin
*Assistant Examiner*—Andrew Sanders
*Attorney, Agent, or Firm*—Townsend and Townsend and Crew; Vernon A. Norviel; Stephen J. LeBlanc

[57] ABSTRACT

A method and circuit for selectively or programmably controlling the polarity of a signal includes a two transistor invertor with its sources coupled to a select signal and its complement and its drains coupled to buffer circuits that pull the drains to full CMOS voltage rail levels. The circuit consumes no standby current and is fully restoring.

6 Claims, 1 Drawing Sheet

5,495,182

FAST-FULLY RESTORING POLARITY CONTROL CIRCUIT

This invention relates to the field of electronic circuits. More particularly, this invention relates to polarity control circuits with full restore and limited power consumption.

BACKGROUND OF THE INVENTION

In digital electronic circuits, it is often desirable to provide a way for selectively controlling the polarity of a signal. A circuit designer may, for example, wish to design a circuit where the polarity of a clock signal can be changed in response to a select signal. In programmable logic circuits, such as Field Programmable Gate Arrays or Programmable Logic Devices, it is often desirable to allow the end user to configure the polarity of a signal by setting a RAM bit. Such programmability is generally accomplished by a "selective inverter," which is an inverter circuit that in response to a select signal either provides at its output the inverse of its input or its non-inverted input. A selective inverter circuit is also referred to in the art as a "polarity control circuit".

FIG. 1 shows one type of polarity control circuit useable in CMOS integrated circuit designs. As shown in FIG. 1, the input signal, after passing through inverters 10 and 13, and its complement, from inverter 10, are input into a 2:1 multiplexer made up of CMOS transmission gates 20 and 23. The signal SELECT and its complement, from the output of inverter 16, turn on either transmission gate 20 or 23. When SELECT is high, gate 23 is on, gate 20 is off, and the OUTPUT signal follows the INPUT signal. When SELECT is low, gate 20 is on, gate 23 is off, and the OUTPUT signal is the inverse of the INPUT signal.

The 2:1 multiplexer implementation shown in FIG. 1 has two notable disadvantages. First, the output signal is being driven through a transmission gate, either 20 or 23, which is undesirable in terms of speed and for driving large capacitive loads. An additional buffer stage can be added following the transmission gate but this will add a further delay. Secondly, an inherent skew is introduced between the two polarities due to the presence of one additional inverter 13 in the true data path.

FIG. 2 shows a polarity control circuit designed to correct some of these deficiencies. As shown in FIG. 2, the input signal is passed through a modified inverter constructed from transistors 30 and 33. The invertor is modified by driving the sources of transistors 30 and 33 with complementary SELECT logic functions rather than hard wiring each to its respective power rail as would be done in a typical inverter.

The circuit of FIG. 2 will have improved driving characteristics because the output node is driven directly by a power stage, inverter 36. The circuit of FIG. 2 will additionally have less skew between polarities because there is only one path for signal flow from input to output.

However, one limitation of this circuit is that the intermediate node HO does not swing to full CMOS levels when the SELECT signal is low, and hence DC power is consumed in the second stage because one of the two transistors forming inverter 36 is not completely turned off. This is clearly undesirable for low voltage applications or in designs that require minimum standby current consumption. Programmable Logic Device designs often require minimum standby current consumption and may incorporate a large number of polarity control circuits thereby compounding the problem.

What is needed is a polarity control circuit with fast speed and good driving characteristics that consumes essentially zero standby current.

SUMMARY OF THE INVENTION

The present invention combines the technique used in FIG. 2 with a novel mechanism for eliminating standby power consumption.

DESCRIPTION OF THE PREFERRED EMBODIMENT

Figure 1:
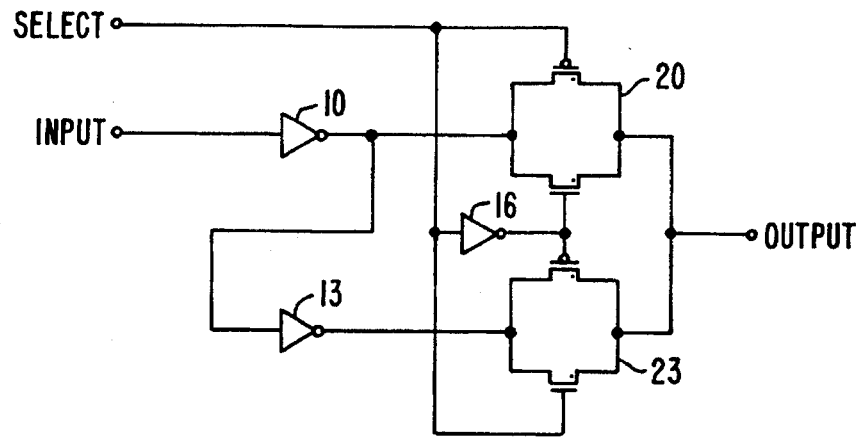
FIG. 1 is a schematic of a polarity control circuit using two pass devices.
Figure 2:
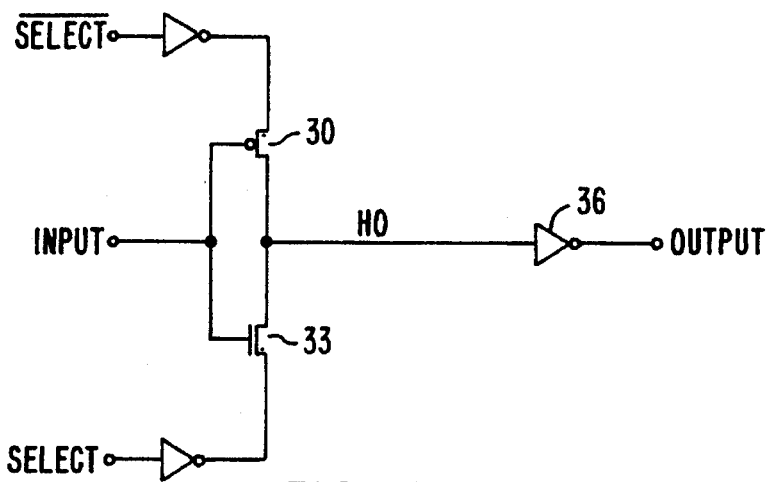
FIG. 2 is a schematic of a polarity control circuit using a modified inverter.
Figure 3:
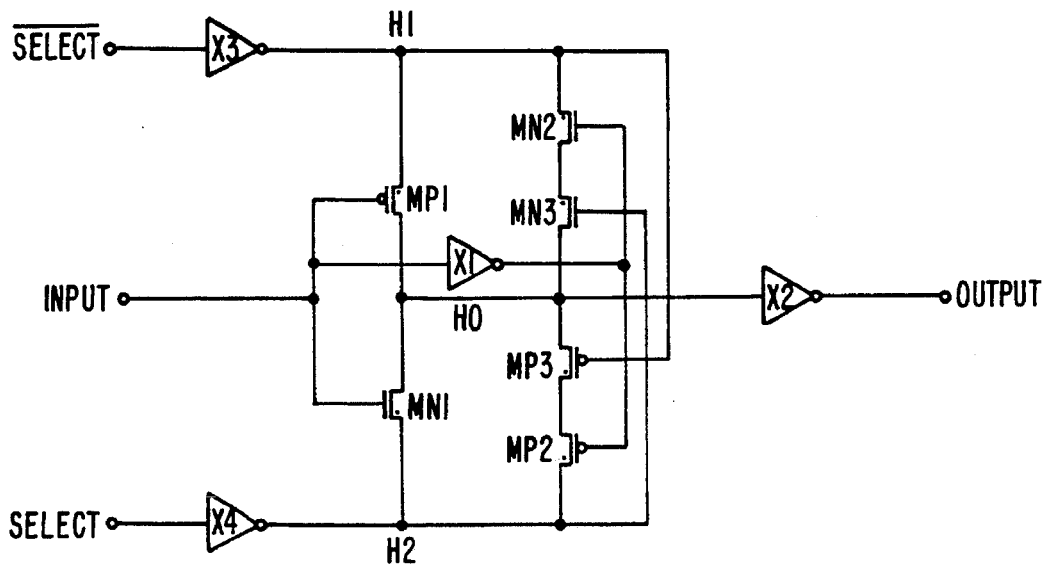
FIG. 3 is a schematic of a polarity control circuit with full restore according to the present invention.

The circuit is shown in FIG. 3. There are six additional transistors in this circuit as compared to FIG. 2, MN2, MN3, MP2, MP3 and the two that form inverter X1. These devices provide a full restore of node HO to CMOS levels independent of the selected polarity. The operation of the circuit will now be described.

When signal SELECT is high the true sense of the input signal is desired at the output and node H1 is held at a CMOS high and node H2 is held at a CMOS low. Transistors MN3 and MP3 are cutoff and the circuit behaves as two series connected inverters. When signal SELECT is low the complementary sense of the input signal is desired and node H1 is held at a CMOS low and node H2 is held at a CMOS high. Under this condition transistor MP1 can only pull node HO down to a voltage level equal to $V_{tp}$ and similarly transistor MN1 can only pull that node up to $'V_{cc}-V_{tm}'$ before cutting off. However, transistors MN3 and MP3 are now conducting and an inverter is now formed by devices MN2 and MP2. This inverter samples the complement of the input signal and restores node HO to the appropriate CMOS level. Together, transistors MN2, MP2, MN3, and MP3 act as a tri-state buffer inverter. In a different embodiment, the sources of MN2 and MP2 can be hardwired to ground and $V_{cc}$ respectively without changing the functional operation of the circuit because the series NMOS stack serves to restore node H0 to ground and the series PMOS stack serves to restore node H0 to $V_{cc}$.

Note that the six transistors just described need only be small, i.e. narrow width, devices relative to MN1, MP1 and inverter X2. MN1 and MP1 provide the majority of the drive during saturation and MN2, MN3, MP2 and MP3 provide the remaining current to fully restore node HO after MN1 and MP1 have cutoff. Also, since these devices are small they present little additional loading to the input and node HO which means there is a minimal impact on performance.

The invention has now been explained with reference to specific embodiments. Other embodiments will be apparent to those of skill in the art. For example, the polarity of all signals could be reversed and N-type transistors could be substituted for P-type transistors and P-type could be substituted for N-type transistors.

What is claimed is:

1. A polarity control circuit comprising;

an inverter comprising first and second transistors with the source of said first transistor coupled to a select signal and the source of said second transistor coupled to the compliment of said select signal and the gates of said transistors coupled to an input signal;

a tri-state buffer inverter coupled to the drains of said transistors, said buffer inverter pulling said drains to full CMOS voltage rail levels when said input signal and said select signal have a particular value; and an output buffer for driving an output signal in response to the voltage signal on said drains.

2. The circuit of claim 1 further comprising first and second inverters receiving said select signal and its compliment.

3. The circuit according to claim 1 wherein said tri-state buffer inverter comprises:

a first N-type transistor having its gate coupled to the compliment of said input signal and its source coupled to said select signal;

a second N-type transistor having its gate coupled to the compliment of said select signal, its source coupled to the drain of said first N-type transistor and its drain coupled to the drains of said inverter;

a first P-type transistor having its gate coupled to the compliment of said input signal and its source coupled to the compliment of said select signal; and a second P-type transistor having its gate coupled to said select signal its source coupled to the drain of said first P-type transistor and its drain coupled to the drains of said inverter.

4. The circuit according to claim 1 wherein said tri-state buffer inverter comprises:

a first N-type transistor having its gate coupled to the compliment of said input signal and its source coupled to ground;

a second N-type transistor having its gate coupled to the compliment of said select signal, its source coupled to the drain of said first N-type transistor and its drain coupled to the drains of said inverter;

a first P-type transistor having its gate coupled to the compliment of said input signal and its source coupled to the power supply voltage; and a second P-type transistor having its gate coupled to said select signal, its source coupled to the drain of said first P-type transistor and its drain coupled to the drains of said inverter.

5. A polarity control circuit comprising:

a first inverter with its input coupled to the inverse of a select signal;

a second inverter with its input coupled to a select signal;

a first P-type transistor with its source coupled to the output of said first inverter its gate coupled to an input signal and its drain coupled to a node HO;

a first N-type transistor with its source coupled to the output of said second inverter its gate coupled to said input signal and its drain coupled to said node HO;

a third inverter with its input coupled to said input signal;

a second N-type transistor with its source coupled to the output of said first inverter and its gate coupled to the output of said third inverter;

a third N-type transistor with its source coupled to the drain of said second N-type transistor, its drain coupled to said node HO, mid its gate coupled to the output of said second inverter;

a second P-type transistor with its drain coupled to said node HO and its gate coupled to the output of said first inverter;

a third P-type transistor with its drain coupled to the source of said second P-type transistor its gate coupled to the output of said third inverter and its source coupled to the output of said second inverter; and an output driver inverter with its input coupled to node HO.

6. In a programmable logic device:

a method for controlling the polarity of a large number of signals without excessive power dissipation, comprising the steps of constructing for each signal the polarity of which is desired to be selectable, a polarity control circuit, said polarity control circuit comprising:

means for receiving a select signal and its compliment;

an inverter comprising two transistors with the sources of said transistors coupled to said select signal and said compliment and the gates of said transistors coupled to an input signal;

a tri-state buffer inverter coupled to the drains of said transistors, said buffer inverter pulling said drains to full CMOS voltage levels when said input signal and said select signal have a particular value; and output buffer means for driving an output signal in response to the voltage signal on said drains;

coupling the select lines of said polarity control circuits to a programmable means for providing a logic signal.

* * * * *